United States Patent
Kim

(10) Patent No.: US 7,205,184 B2
(45) Date of Patent: *Apr. 17, 2007

(54) METHOD OF CRYSTALLIZING SILICON FILM AND METHOD OF MANUFACTURING THIN FILM TRANSISTOR LIQUID CRYSTAL DISPLAY

(75) Inventor: Heon-je Kim, Seongnam (KR)

(73) Assignee: Samsung Electronics Co., Ltd., Suwon-si (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/172,135

(22) Filed: Oct. 14, 1998

(65) Prior Publication Data

US 2001/0012702 A1 Aug. 9, 2001

(30) Foreign Application Priority Data

Oct. 14, 1997 (KR) .................................. 97-52638

(51) Int. Cl.
*H01L 29/04* (2006.01)
(52) U.S. Cl. ...................... 438/166; 438/487; 438/749; 438/945; 117/10; 257/E21.134
(58) Field of Classification Search ................ 438/166, 438/149, 162, 795, 487, 749, 945, FOR. 201, 438/FOR. 242, FOR. 269, FOR. 334, FOR. 418; 148/DIG. 93, DIG. 91, DIG. 90; 257/E21.134; 117/10
See application file for complete search history.

(56) References Cited

U.S. PATENT DOCUMENTS

| 4,330,363 A | * | 5/1982 | Biegesen et al. ............. 117/54 |
| 4,514,895 A | * | 5/1985 | Nishimura ................... 438/166 |
| 4,545,823 A | * | 10/1985 | Drowley ..................... 438/481 |
| 4,604,159 A | * | 8/1986 | Kobayashi et al. ......... 438/412 |
| 4,763,183 A | * | 8/1988 | Ng et al. ..................... 257/288 |
| 4,959,700 A | * | 9/1990 | Yamazaki ................... 257/347 |
| 5,264,072 A | * | 11/1993 | Mukai ......................... 117/43 |
| 5,264,303 A | * | 11/1993 | McCaffery ................... 429/99 |
| 5,275,851 A | * | 1/1994 | Fonash et al. |

(Continued)

FOREIGN PATENT DOCUMENTS

JP          58086730 A  *  5/1983

(Continued)

OTHER PUBLICATIONS

Lee et al., Low Temp. Poly-Si TFT Fabricatio by MILC, (IEEE), pp. 160-163, 1996.*

(Continued)

*Primary Examiner*—George Fourson
(74) *Attorney, Agent, or Firm*—F. Chau & Associates

(57) ABSTRACT

A method of crystallizing a silicon film by which it is possible to obtain a polycrystalline silicon thin film having a uniform crystal structure and a good quality, and a method of manufacturing a thin film transistor-liquid crystal display (TFT-LCD) using the same. In the method of crystallizing the silicon film, an amorphous silicon film is formed on a substrate and a reflective film pattern is formed on the amorphous silicon film. The silicon film is crystallized by irradiating a laser onto the amorphous silicon film. The reflective film pattern is formed to expose the channel of the thin film transistor in the amorphous silicon film.

15 Claims, 6 Drawing Sheets

U.S. PATENT DOCUMENTS

| | | | | |
|---|---|---|---|---|
| 5,373,803 | A | * | 12/1994 | Noguchi et al. ............... 117/8 |
| 5,382,537 | A | * | 1/1995 | Noguchi .................... 438/162 |
| 5,432,122 | A | * | 7/1995 | Chae ........................ 438/157 |
| 5,488,000 | A | * | 1/1996 | Zhang et al. |
| 5,529,951 | A | * | 6/1996 | Noguchi et al. ............ 438/487 |
| 5,569,610 | A | * | 10/1996 | Zhang et al. |
| 5,569,624 | A | * | 10/1996 | Weiner ...................... 438/285 |
| 5,569,936 | A | * | 10/1996 | Zhang et al. ................. 257/66 |
| 5,817,548 | A | * | 10/1998 | Noguchi et al. ............ 438/160 |
| 5,843,225 | A | * | 12/1998 | Takayama et al. ............. 117/8 |
| 5,854,096 | A | * | 12/1998 | Ohtani et al. |
| 5,888,839 | A | * | 3/1999 | Ino et al. ...................... 438/30 |
| 5,888,857 | A | * | 3/1999 | Zhang et al. |
| 5,915,174 | A | | 6/1999 | Yamazaki et al. |
| 5,922,125 | A | | 7/1999 | Zhang et al. |
| 5,930,591 | A | * | 7/1999 | Huang ......................... 438/36 |
| 5,935,597 | A | * | 8/1999 | Visser ....................... 424/449 |
| 5,956,579 | A | | 9/1999 | Yamazaki et al. |
| 5,989,944 | A | * | 11/1999 | Yoon .......................... 438/149 |
| 6,008,101 | A | * | 12/1999 | Tanaka et al. ............. 438/308 |
| 2004/0211356 | A1 | * | 10/2004 | Yamazaki et al. ........... 117/84 |

FOREIGN PATENT DOCUMENTS

| | | | | |
|---|---|---|---|---|
| JP | 58165317 | A | * | 9/1983 |
| JP | 59154016 | A | * | 9/1984 |
| JP | 59161014 | A | * | 9/1984 |
| JP | 60136306 | A | * | 7/1985 |
| JP | 60213018 | A | * | 10/1985 |
| JP | 61020314 | A | * | 1/1986 |
| JP | 61142735 | A | * | 6/1986 |
| JP | 04-119633 | | * | 4/1992 |
| JP | 9-191114 | | | 7/1997 |
| JP | 9-213966 | | | 8/1997 |

OTHER PUBLICATIONS

Lee et al., Fabrication of High-Mobility p-Channel Poly-Si TFTs by Self Aligned MILC, pp. 407-409, (IEEE), 1996.*

Cao et al., A High Performance Polysilicon TFT Using XeCl Excimer Laser Crystallization of Pre-Patterned a-Si films, (IEEE), pp. 561-567, 1996.*

Giust, G.K. et al, "Performance Improvement Obtained for Thin-Film Transistors Fabricated in Prepatterned Laser-Recrystallized Polysilicon", IEEE Electron Device Letters, vol. 18, No. 6, Jun. 1997.*

Cao, M. et al, "A High-Performance Polysilicon Thin-Film Transistor Using XeCl Excimer Laser Crystallization of Per-Patterned Amorphous Si Films", IEEE Transactions on Electron Devices, vol. 43, No. 4, Apr. 1996.*

Jeon, Jae-Hong, "A New Polycrystalline Silicon TFT with a Single Grain Boundary in the Channel", IEEE Electron Device Letters, vol. 22, No. 9, Sep. 2001.*

Wang, Hongwei, et al.*

* cited by examiner

METHOD OF CRYSTALLIZING SILICON FILM AND METHOD OF MANUFACTURING THIN FILM TRANSISTOR LIQUID CRYSTAL DISPLAY

BACKGROUND OF THE INVENTION

1. Field of the Invention

The present invention relates to a method of crystallizing a silicon film and a method of manufacturing a liquid crystal display, and more particularly, to a method of crystallizing a silicon film using a laser and a method of manufacturing a thin film transistor liquid crystal display using the same.

2. Description of the Related Art

A thin film transistor (TFT) is mainly used as a switching device of a liquid crystal display (LCD). A polycrystalline silicon forming a semiconductor layer used as a channel of the TFT is formed by crystallizing an amorphous silicon film.

The most widely used method of crystallizing the amorphous silicon film is an annealing method using a pulsed UV beam, i.e., an excimer laser. A laser annealing has been developed for annealing silicon into which impurity ions are implanted in a large scale integration (LSI) process. This method has been applied to the development of a display device having a large area. Recently, it began to be applied to the manufacturing of low temperature polycrystalline silicon TFT-LCD products having medium and small sizes. The method of manufacturing a good quality of polycrystalline silicon by annealing the amorphous silicon thin film using a laser has an advantage in that a substrate is not damaged since thermal annealing is performed within a short time though a melting temperature is high.

The change of phase from the amorphous silicon to the polycrystalline silicon is performed through two physical mechanisms such as a nucleation in which a crystal is formed and a growth in which the generated crystal is grown. Therefore, if it is possible to suppress the nucleation and to allow the growth to occur after the amorphous silicon is completely melted, the method is suitable for improving the crystal structure of the polycrystalline silicon.

FIG. 1 is a sectional view describing a method of crystallizing the silicon film using conventional laser annealing. Reference numerals 10 and 15 respectively denote a transparent substrate and an amorphous silicon film formed on the transparent substrate 10.

According to the conventional method of crystallizing the silicon film, the crystallization is performed by irradiating a laser on amorphous silicon film 15, thus temporarily melting and cooling the silicon film. At this time, the melting temperature of the amorphous silicon film and the state of the crystallization vary according to the energy intensity of the irradiated laser. For example, with a higher energy intensity of the irradiated laser, the deeper amorphous silicon film is melted from the surface. As the energy intensity increases, the amount of melted silicon film increases. The amorphous silicon film is completely melted beyond a predetermined threshold energy intensity. The grain size of the crystallized silicon is proportionaal to the energy intensity of the irradiated laser. Namely, as more amorphous silicon film is melted, the grain size increases. This is because small grains are generated during a process in which only the surface of the amorphous silicon film is melted by the energy intensity less than the threshold energy and is cooled. Since a small amount of amorphous silicon film is left and the rest of the silicon film is nearly completely melted by the energy intensity of the laser approximate to the threshold energy intensity, the silicon film which is not melted operates as a seed, thus crystallizing a larger grain. When the amorphous silicon film is completely melted by heightening the energy intensity of the laser to higher than the threshold energy intensity, the grain size is reduced since there is no silicon film left which will operate as a seed and the crystallization is performed on the basis of irregular nucleation and growth.

In general, in order to manufacture a TFT device having excellent performance, the size of the crystal grain of the polycrystalline silicon must be large and the defect intensity and the surface roughness of the crystal must be small. In particular, the crystal grains and the crystal defects operate as a scattering factor with respect to the movement of a charge carrier, thus deteriorating field effect mobility. This is why a method of leaving only the amorphous silicon film which operates as the seed by approximating the energy intensity of the laser to the threshold energy intensity was used in a conventional technology.

However, since the range of energy intensity in which a large grain can be obtained is very narrow in the conventional method, the width of an allowable margin is very narrow during the process. Also, since grains are irregularly located in the polycrystalline silicon crystallized by the conventional method, it is difficult to secure a uniform element characteristic when the polycrystalline silicon is used as a semiconductor layer in which the channel area of the TFT is formed.

As shown in FIG. 2, an LCD is comprised of a pixel portion and a driving circuit portion.

Referring to FIG. 2, an LCD panel for displaying a picture is comprised of a pixel portion in which a thin film transistor and a pixel electrode are arranged and a driving circuit located around the pixel portion for driving the thin film transistor and realizing a picture in the pixel portion.

The TFT is formed in the pixel portion and the driving circuit portion. However, the crystallization is not considered as an important factor in the TFT of the pixel portion since a large area can be easily driven by satisfying a mobility of about 20–50 $cm^2/Vs$. However, a high uniformity is required to reduce leakage current.

An N channel TFT and a P channel TFT must be formed in the driving circuit portion. Since the characteristics of the TFTs affect the driving of the LCD panel, the polycrystalline silicon film used for the driving circuit preferably has a single crystal.

In the conventional technology, one silicon film was used for the TFT of the pixel portion and the TFT of the driving circuit portion. It was difficult to satisfy the need of the TFT of the driving circuit portion in which the crystallization which affects the characteristic of the TFT is important and the need of the TFT of the pixel portion in which the uniformity is more important than the crystallization at the same time. Therefore, it was difficult to manufacture an improved LCD.

SUMMARY OF THE INVENTION

It is an objective of the present invention to provide a method of crystallizing a silicon film by which it is possible to form a silicon film in which crystals are uniform and have an excellent characteristic.

It is another objective of the present invention to provide a method of manufacturing a thin film transistor liquid crystal display (TFT-LCD) having an excellent characteristic.

Accordingly, in a method for crystallizing a silicon film according to the present invention, an amorphous silicon film is formed on a substrate. A reflective film pattern is formed on the amorphous silicon film. The silicon film is crystallized by irradiating a laser onto the amorphous silicon film.

The reflective film pattern exposes a part formed to be the channel of a thin film transistor in the amorphous silicon film. For example, the reflective film pattern may be formed of a metal having a thickness of 500 Å–700 Å.

The temperature of the substrate is maintained to be lower than 500° C. and a non-scan multiple pulse method is preferably performed in the step of crystallizing the silicon film.

In another method of crystallizing a silicon film according to the present invention, an amorphous silicon film is formed on a substrate. The amorphous silicon film is patterned to have a shape of an island. The silicon film is crystallized by irradiating a laser onto the amorphous silicon film.

A mask layer for covering the part which will operate as the seed may be formed on the patterned amorphous silicon film before the step of crystallizing the silicon film. The mask layer is preferably formed of a metal, a photoresist, or a silicon film.

The length of one side of the patterned amorphous silicon film is preferably not more than 5 μm in the step of patterning the amorphous silicon film.

To achieve the second object, in a method of manufacturing a thin film transistor-liquid crystal display (TFT-LCD) according to the present invention, an amorphous silicon film is formed on the overall surface of a substrate including a pixel portion and a driving circuit portion. The amorphous silicon film of the driving circuit portion is patterned to have a shape of an island. The silicon film is crystallized by irradiating a laser onto the amorphous silicon film. A source and a drain of a thin film transistor are respectively formed in the pixel portion and the driving circuit portion by doping impurities on the crystallized silicon film.

A mask layer for covering the part which will operate as the seed may be formed on the patterned amorphous silicon film before the step of crystallizing the silicon film. The mask layer is preferably formed of a metal, a photoresist, or a silicon film.

The length of one side of the patterned amorphous silicon film is not more than 5 μm in the step of patterning the amorphous silicon film.

According to the present invention, it is possible to obtain a polycrystalline silicon thin film in which crystallization is well performed and the structure of a crystal is uniform. Since the polycrystalline silicon film has a high mobility, it is possible to manufacture a thin film transistor having an excellent characteristic.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Hereinafter, the present invention will be described in detail with reference to the attached drawings.

Figure 1:
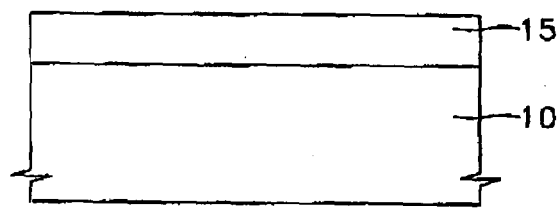
FIG. 1 is a sectional view describing a method of crystallizing a silicon film using conventional laser annealing.
Figure 2:
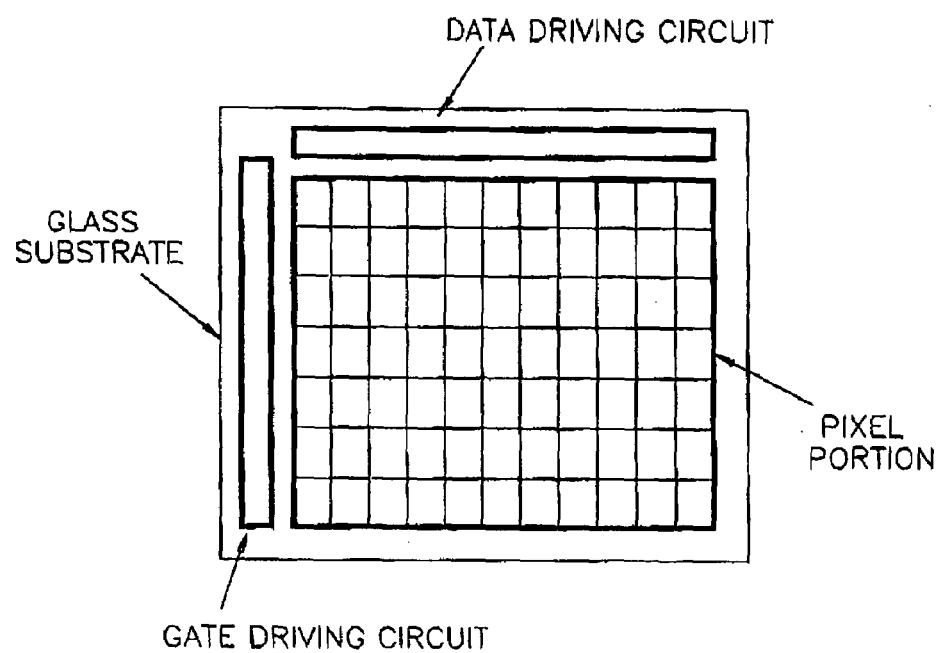
FIG. 2 shows a general liquid crystal display (LCD) panel.
Figure 3A:
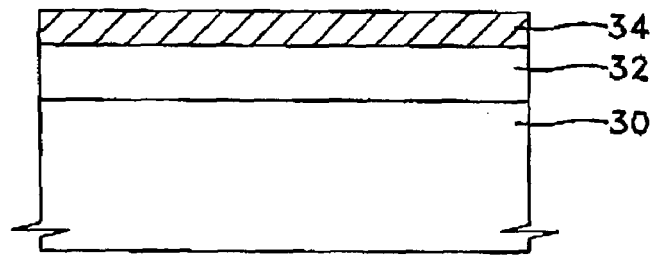
FIGS. 3a through 3c are sectional views describing a method of crystallizing a silicon film according to a first embodiment of the present invention.
Figure 3B:
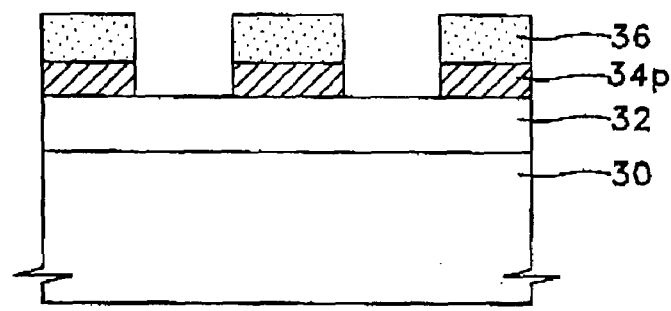
Figure 3C:
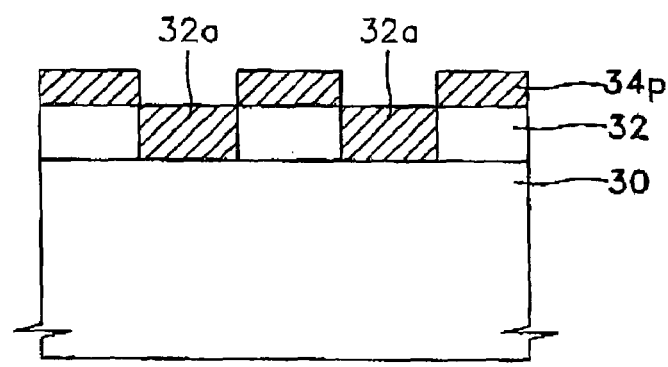

FIGS. 3a through 3c are sectional views describing a method of crystallizing a silicon film according to a first embodiment of the present invention.

Referring to FIG. 3a, an amorphous silicon film 32 having a predetermined thickness is formed by depositing amorphous silicon on a substrate 30. A reflective film 34 is formed on the overall surface of the amorphous silicon film 32. The reflective film 34 can be formed using a metal used for the manufacturing of the LCD, i.e., an aluminum alloy like an Al—Nd used as a gate electrode material of a TFT. The thickness is preferably 100–1,000 Å.

Referring to FIG. 3b, a photosensitive film pattern 36 is formed on the reflective film 34 (FIG. 3a) in order to perform a general photolithography process. The photosensitive pattern 36 is formed in stripes. The width of the stripes is determined by the length of the part to be the channel of the thin film transistor and the maximum heating temperature of a substrate. Then, a reflective film pattern 34p for exposing an amorphous silicon film 32 in which a channel is to be formed is formed by patterning the reflective film 34 (FIG. 3a) using the photosensitive film pattern 36 as a mask.

Referring to FIG. 3c, after removing the photosensitive film pattern, a laser of a predetermined pulse is irradiated to the amorphous silicon film 32 partially masked by the reflective film pattern 34p. At this time, laser is irradiated onto a part of the silicon film in which the photosensitive film pattern 34p is formed. The amorphous silicon film is completely melted in a moment. Since 95 to 100% of the irradiated laser beam is reflected by the reflective film pattern 34p in the part in which the reflective film pattern 34p is formed, the silicon film is not melted. The crystallization is performed after the silicon film is completely melted. The silicon film which is masked by the reflective film pattern 34p and is not melted operates as a seed. Namely, the crystal is laterally grown from the edge of the silicon film which is not melted on the lower portion of the reflective film pattern 34p to the part in which the reflective film pattern 34p is not formed. Therefore, unlike the crystallizing method according to conventional simple laser annealing, the nucleation having a random crystal direction does not occur. The growth is performed to have a certain crystal direction. Therefore, a polycrystalline silicon film 32a having crystals of large size is formed.

Figure 4:
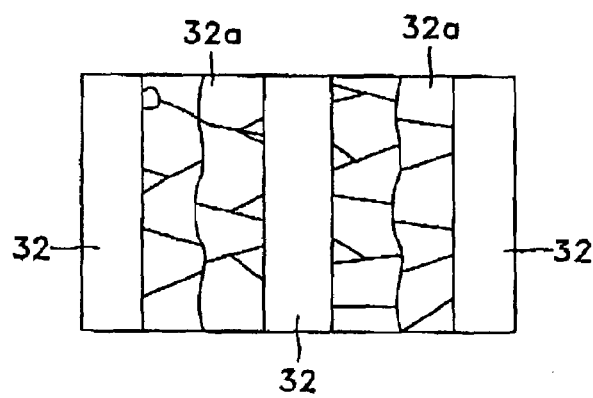
FIG. 4 is a plan view showing the state of the silicon film crystallized by the first embodiment of the present invention.

FIG. 4 is a plan view of the state of a silicon film crystallized by the first embodiment of the present invention. The amorphous silicon film 32 and the polycrystalline silicon film 32a are alternately formed in stripes. The crystal size of the polycrystalline silicon film 32a is relatively large and uniform.

Figure 5:
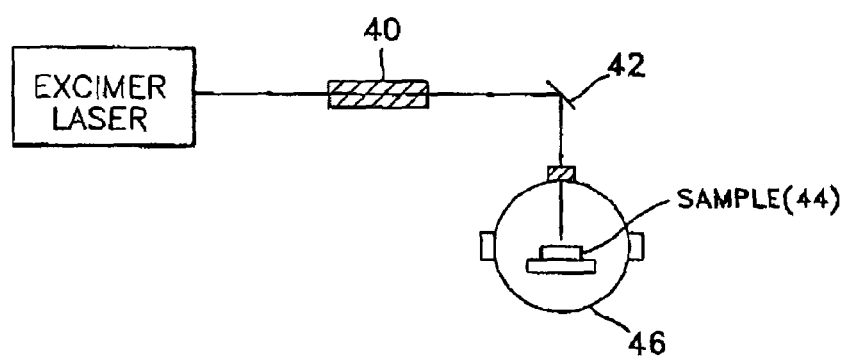
FIG. 5 schematically shows laser crystallizing equipment used in the present invention.

FIG. 5 schematically shows laser crystallizing equipment used in the present invention.

Reference numeral 40 denotes a homogenizer for homogenizing the laser beam and changing it to the shape of a top-hat. Reference numeral 42 denotes a mirror for reflecting the laser beam which passed through the homogenizer and directing the laser beam to the substrate. Reference numeral 44 denotes a substrate on the surface of which the amorphous silicon thin film and the reflective film pattern are sequentially stacked. Reference numeral 46 denotes a vacuum chamber for uniformly maintaining the temperature of the substrate.

As mentioned above, a scanning mode mainly used in the conventional laser crystallization is not used in the laser crystallizing method according to the present invention. A multiple-pulse method in which the laser beam and the sample (substrate) are fixed is used. At this time, the part exposed to the laser beam is the area in which the reflective film pattern is not formed. Ninety-five to 100% of laser beam is reflected from the part in which the reflective film pattern is formed and little laser beam is irradiated onto this part. Therefore, the silicon film in which the reflective film pattern is formed after the laser annealing remains amorphous.

In the laser crystallizing method according to the present invention, the temperature of the substrate before the laser annealing is an important variable. The temperature of the substrate is maintained so that the lateral growth of the crystal is enough and the part in which the reflective pattern does not exist, thus preventing the nucleation. Preferably, the temperature of the substrate must be maintained to be not more than 500° C. The polycrystalline silicon thin film obtained by doing so has a mobility of about 100 $cm^2/Vs$. When the polycrystalline silicon thin film is used, it is possible to manufacture a thin film transistor having superior characteristics to those manufactured by the amorphous silicon or the polycrystalline silicon obtained by solid phase crystallization (SPC) at a high temperature.

Figure 6A:
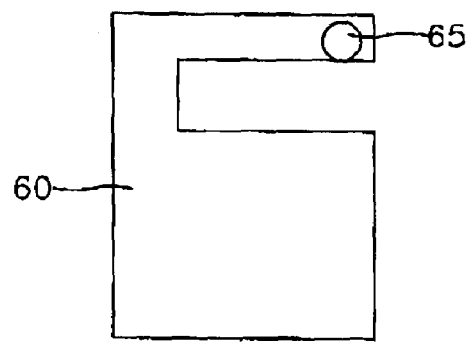
FIGS. 6a through 6c describe a method for crystallizing a silicon film according to a second embodiment of the present invention.
Figure 6B:
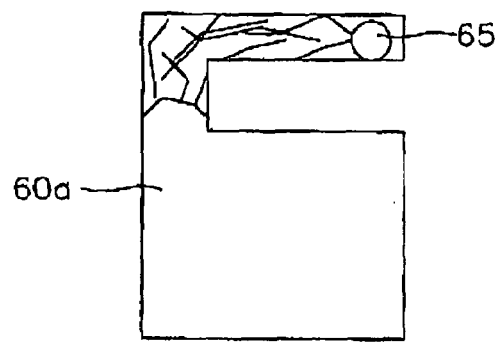
Figure 6C:
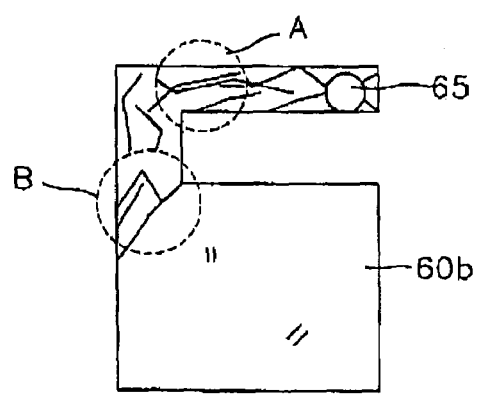

FIGS. 6a through 6c describe the crystallizing method of the silicon film according to the second embodiment of the present embodiment. A process in which the crystallization proceeds is schematically shown.

Figure 7:
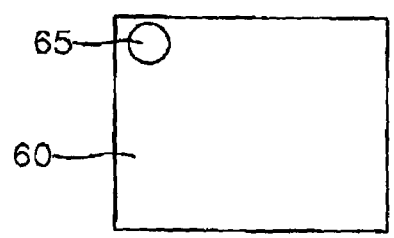
FIGS. 7 through 9 show examples of an amorphous silicon film pattern in the shape of an island.
Figure 8:
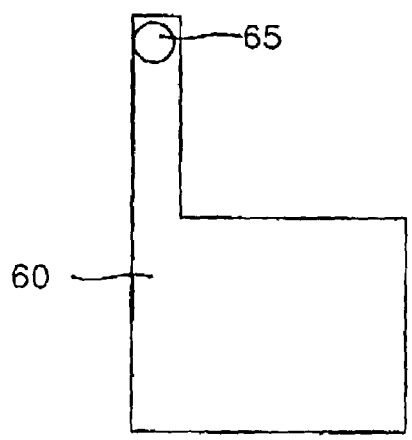
Figure 9:
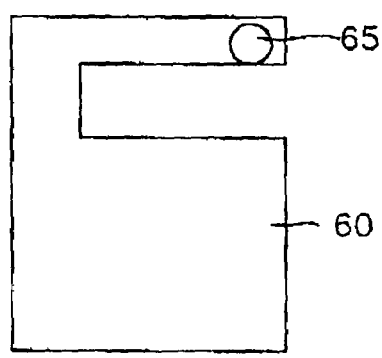

First, an amorphous silicon film 60 is deposited to have a predetermined thickness using a plasma enhanced chemical vapor deposition (PE-CVD) method on a substrate (not shown). Then, the amorphous silicon film is patterned to have a shape of a square island or a transformed pattern as shown in FIGS. 7 through 9. Then, after forming a reflective film on the patterned amorphous silicon film 60, the reflective film is patterned so that the reflective film excluding a seed 65 is removed, in order to restrict the seed part. A laser of a predetermined pulse is then irradiated onto the amorphous silicon film in which the reflective film pattern is formed. At this time, the energy intensity of the irradiated laser is set so that the amorphous silicon film exposed by the reflective film pattern is completely melted.

In the method of restricting the part to be the seed 65, photoresist can be used instead of the reflective film pattern or laser so that one side end of the amorphous silicon film patterned to have the island shape is not melted. Accordingly, the one side end operates as the seed. After the island shaped-amorphous silicon film is completely melted, the crystallization occurs from the seed 65, which will be described in detail as follows with reference to FIGS. 6a through 6c.

Referring to FIGS. 6a and 6b, the crystallization proceeds from the end of the island which is not melted, i.e., the seed 65 to the melted part. Competitive various growths temporarily proceed on the basis of the seed 65.

Referring to FIG. 6c, most growths are extinguished passing the edge of the island and a few live growths proceed. Namely, most crystals which are grown in various crystal directions are extinguished passing a narrow neck portion (reference numeral A). The growth occurs in the direction of the crystals which passed through the neck. Only one growth is alive passing the edge (reference numeral B). The crystallization is finally performed. Therefore, since only one growth is performed in the center 60b of the island, the crystallization is performed in a single crystal state.

FIGS. 7 through 9 show various examples of the amorphous silicon film patterned in the island shape.

The pattern of FIG. 7 has a shape to be easily patterned. However, a probability in which the silicon film is crystallized in a single crystal state is very low. However, it is possible to obtain good crystals in the center of the pattern when the size of the pattern and the size of the seed are appropriately controlled.

In FIGS. 8 and 9, it is certain that the crystals of a single crystal state will have one crystal direction since the selection of the crystal growth occurs due to the competitive growth in a process in which the crystallization proceeds.

As mentioned above, according to the crystallizing method of the silicon film according to the second embodiment of the present invention, it is possible to form a silicon film having an excellent characteristic of a single crystal by suppressing random nucleation and stimulating competitive growth. Therefore, it is possible to improve the characteristic of the TFT-LCD when the method is applied to the manufacturing process of the TFT-LCD.

To be specific, the TFT of the pixel portion in which the uniformity of the crystal is more important than the crystal structure is formed of the polycrystalline silicon film by the conventional crystallizing method. The TFT of the driving circuit portion which requires the polycrystalline silicon film having an excellent characteristic is formed of the silicon film crystallized using the crystallizing method according to the second embodiment of the present invention. Namely, in a process of forming the semiconductor film used as the channel of the TFT, the conventional crystallizing processes is used or the method according to the second embodiment of the present invention can be used in the pixel portion. In the driving circuit portion, a single crystal silicon film is formed using a process of depositing the amorphous silicon film on the substrate, patterning the amorphous silicon film to have the island shape, restricting the part to be the seed, and irradiating laser, thus crystallization is performed. In the conventional technology, the silicon film is crystallized and patterned. However, in the present invention the silicon film is patterned and is crystallized.

Figure 10:
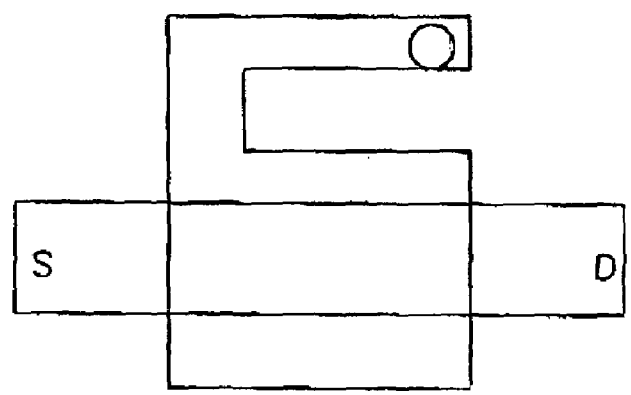
FIG. 10 shows an example using the silicon film formed by the crystallizing method according to the second embodiment of the present invention as the channel of a TFT.

FIG. 10 shows an example in which the silicon film is formed using the crystallizing method according to the second embodiment of the present invention is used the channel of the TFT. The size of the crystal is small in the seed since only several growths are performed. The state of the crystal becomes single in the part to be the channel of the TFT, since only one growth is performed.

In the crystallizing method according to the second embodiment of the present invention, when the size of the amorphous silicon film patterned in the island shape is larger than an appropriate level, the size of the crystal becomes smaller since the random nucleation occurs more often than the competitive growth. Therefore, in order to perform the crystallization of the single crystal, the size of the amorphous silicon film patterned in the island shape must be small enough so as not to cause random nucleation at a low temperature. In particular, it is preferable that the length of one side of the pattern is not more than 5 µm. However, when the method is applied to the TFT-LCD, the size of the pattern must be enough to cover the channel of the TFT.

In general, the length and the width of the channel of the TFT are respectively 7 µm and 20 µm. Considering that the silicon film obtained according to the second embodiment of the present invention has a single crystal structure, it is possible to form a channel having a much smaller size than that of a conventional channel when the polycrystalline silicon film according to the present invention is used. When the size of the channel is reduced, it is impossible to maintain the effective width of the channel. This problem can be solved using a multi-channel.

Figure 11:
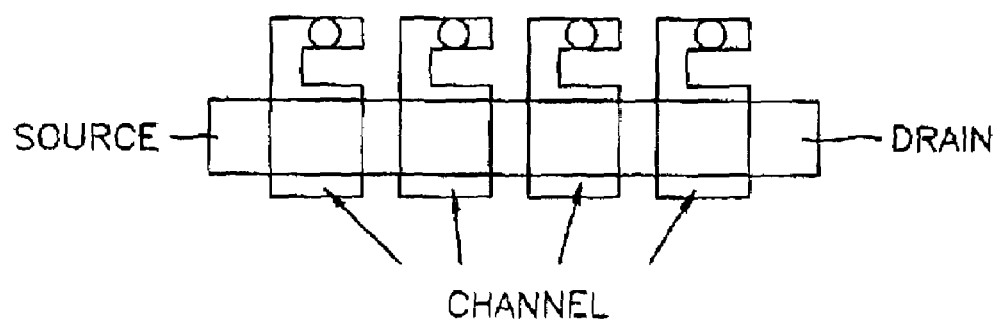
FIG. 11 shows an example of forming the TFT using a multiple channel method.

FIG. 11 shows an example of forming the TFT using a multi-channel method. When the method is used, the overall area is somewhat increased. However, the characteristic of the TFT is remarkably improved considering that the crystal state of the silicon film patterns forming the channel is single.

According to the crystallizing method of the silicon film according to the present invention, the crystallization is performed by forming the reflective film pattern of a film which can reflect the laser beam on the amorphous silicon film and irradiating the laser onto the reflective film pattern. By doing so, the crystallization is not performed in the part in which reflective film pattern is formed since the laser beam is reflected. The laser is irradiated to the part in which the reflective film pattern does not exist, thus the crystallization is performed. Therefore, it is possible to obtain a good polycrystalline silicon thin film having an excellent and uniform crystal structure. Since the polycrystalline silicon film obtained by doing so has high mobility, it is possible to manufacture the thin film transistor having excellent characteristics using the polycrystalline silicon film.

Also, when the crystallization proceeds after patterning the amorphous silicon film to have the island shape before forming the reflective film pattern and restricting the seed part using the reflective film pattern, it is possible to suppress random nucleation and stimulate competitive growth. Accordingly, it is possible to obtain a polycrystalline silicon film formed of a large single crystal. When the method is applied to the driving circuit portion of the TFT-LCD, it is possible to manufacture an excellent TFT-LCD since it is possible to satisfy the characteristic of the driving circuit portion which requires the excellent characteristic of the TFT.

The present invention is not restricted to the above embodiments, and it is clearly understood that many variations are possible within the scope and spirit of the present invention by anyone skilled in the art.

What is claimed is:

1. A method of crystallizing a silicon film, comprising:
   forming an amorphous silicon film having an island shape on a substrate, the island shaped amorphous silicon film comprising a first portion, a second portion spaced apart from the first portion and a connection portion formed between the first portion and the second portion;
   masking the first portion to selectively expose the second portion; and
   melting the second portion and the connection portion by irradiating a laser beam onto the exposed second portion and the connection portion and then crystallizing the melted second portion and the melted connection portion by utilizing amorphous silicon of the masked first portion as a seed,
   wherein a width of the second portion is larger than that of the first portion.

2. The method of claim 1, wherein the amorphous silicon film has a square island shape.

3. The method of claim 1, wherein the amorphous silicon film has a square island shape having a recess formed at one side thereof.

4. The method of claim 1, wherein the amorphous silicon film has a square island shape having a recess formed at an edge thereof.

5. The method of claim 1, wherein one side of the amorphous silicon film is no longer than 5 µm.

6. The method of claim 1, wherein the island shaped amorphous silicon film further comprises a neck portion for controlling the direction of crystal growth in the amorphous silicon film.

7. The method of claim 1, wherein the masking of the first portion comprises forming a mask layer formed of a metal, a photoresist or a silicon film on the first portion of the amorphous silicon film.

8. The method of claim 1, further comprising forming a transistor having a channel region in the crystallized second portion.

9. A method of crystallizing a silicon film, comprising:
   defining a pixel area and a driving circuit area on a substrate;
   forming an amorphous silicon film having an island shape on the driving circuit area of the substrate, the island shaped amorphous silicon film having a first portion, a second portion spaced apart from the first portion and a connection portion between the first portion and the second portion;
   masking the first portion of the island shaped amorphous silicon film;
   melting the second portion and the connection portion by irradiating a laser beam onto the exposed second portion and the connection portion and then crystallizing the melted second portion and the melted connection portion by utilizing amorphous silicon of the masked first portion as a seed; and
   forming a channel region in the crystallized second portion in the driving circuit,
   wherein a width of the second portion is larger than that of the first portion.

10. The method of claim 9, wherein the amorphous silicon film in the driving circuit area has a square island shape.

11. The method of claim 9, wherein the amorphous silicon film in the driving circuit area has a square island shape having a recess formed at one side thereof.

12. The method of claim 9, wherein the amorphous silicon film in the driving circuit area has a square island shape having a recess formed at an edge thereof.

13. The method of claim 9, wherein one side of the amorphous silicon film is no longer than 5 µm.

14. The method of claim 9, wherein the island shaped amorphous silicon film further comprises a neck portion for controlling the direction of crystal growth in the amorphous silicon film.

15. The method of claim 9, wherein the masking comprises the forming of a mask layer formed of a metal, a photoresist or a silicon film on the first portion of the amorphous silicon film.

* * * * *